(12) United States Patent
Maszara et al.

(10) Patent No.: US 6,630,720 B1
(45) Date of Patent: Oct. 7, 2003

(54) ASYMMETRIC SEMICONDUCTOR DEVICE HAVING DUAL WORK FUNCTION GATE AND METHOD OF FABRICATION

(75) Inventors: Witold P. Maszara, Morgan Hill, CA (US); HaiHong Wang, Fremont, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 30 days.

(21) Appl. No.: 10/036,210

(22) Filed: Dec. 26, 2001

(51) Int. Cl.$^7$ ............................................. H01L 29/76
(52) U.S. Cl. ..................................................... 257/407
(58) Field of Search ................................. 438/197, 585, 438/586, 592, 595, 596, 669, 696, 703, 713; 257/401, 407, 347, 378, 357

(56) References Cited

U.S. PATENT DOCUMENTS

| | | |
|---|---|---|
| 4,745,079 A | 5/1988 | Pfiester |
| 4,755,478 A | 7/1988 | Abernathey et al. |
| 5,061,647 A | 10/1991 | Roth et al. |
| 5,210,435 A | 5/1993 | Roth et al. |
| 5,593,909 A | 1/1997 | Han et al. |
| 5,717,237 A | 2/1998 | Chi |
| 5,756,365 A | 5/1998 | Kakumu |
| 5,770,490 A | 6/1998 | Frenette et al. |
| 5,894,157 A | 4/1999 | Han et al. |
| 5,960,270 A * | 9/1999 | Misra et al. ............... 438/197 |
| 5,977,591 A | 11/1999 | Fratin et al. |
| 6,013,553 A | 1/2000 | Wallace et al. |
| 6,020,024 A | 2/2000 | Maiti et al. |
| 6,028,339 A | 2/2000 | Frenette et al. |
| 6,051,487 A | 4/2000 | Gardner et al. |
| 6,087,208 A | 7/2000 | Krivokapic et al. |
| 6,097,070 A | 8/2000 | Mandelman et al. |
| 6,107,667 A | 8/2000 | An et al. |
| 6,204,137 B1 * | 3/2001 | Teo et al. ................... 438/305 |
| 6,207,485 B1 | 3/2001 | Gardner et al. |
| 6,210,999 B1 | 4/2001 | Gardner et al. |
| 6,211,555 B1 | 4/2001 | Randazzo et al. |
| 6,225,669 B1 | 5/2001 | Long et al. |
| 6,274,467 B1 | 8/2001 | Gambino et al. |
| 6,281,559 B1 | 8/2001 | Yu et al. |
| 6,297,106 B1 | 10/2001 | Pan et al. |
| 6,300,177 B1 * | 10/2001 | Sundaresan et al. ........ 438/197 |
| 6,429,068 B1 | 8/2002 | Divakaruni et al. |

FOREIGN PATENT DOCUMENTS

| | | |
|---|---|---|
| EP | 1033752 | 6/2000 |
| JP | 411317459 | 11/1999 |
| WO | 9703462 | 1/1997 |

* cited by examiner

Primary Examiner—Caridad Everhart
(74) Attorney, Agent, or Firm—Renner, Otto, Boisselle & Sklar, LLP

(57) ABSTRACT

An asymmetric semiconductor device and a method of making a pair of the asymmetric devices. The semiconductor device includes a layer of semiconductor material having a source and a drain, and a dual work function gate disposed on the layer of semiconductor material to define a channel interposed between the source and the drain.

21 Claims, 2 Drawing Sheets

ASYMMETRIC SEMICONDUCTOR DEVICE HAVING DUAL WORK FUNCTION GATE AND METHOD OF FABRICATION

TECHNICAL FIELD

The present invention relates generally to semiconductor devices and the fabrication thereof and, more particularly, to an asymmetric semiconductor device having a dual work function gate.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. In FET devices with a channel having a relatively short length, the FET can experience a number of undesirable electrical characteristics referred to as short channel effects (SCE). SCE generally occur when the gate does not have adequate control over the channel region, and can include threshold voltage ($V_t$) roll-off, off current (Ioff) roll-up and drain induced barrier lowering (DIBL). As the physical dimensions decrease, SCE can become more severe. SCE is the result of intrinsic properties of the crystalline materials used in the FET devices. Namely, the band gap and built-in potential at the source/body and drain/body junctions are non-scalable with the reduction of physical device dimensions, such as a reduction in channel length.

A typical technique used to minimize SCE is to fabricate FETs with extensions as part of the source/drain areas. The extensions are commonly formed using a lightly doped drain (LDD) technique as is well known in the art.

In addition, achieving a desired device dimension is often difficult as device designers are constrained by limitations imposed by various manufacturing techniques. For example, photolithography is often used to pattern a mask layer that is used to determine the size and placement of device components, such as the gate. However, lithographic limits restrict gate formation to a certain minimum length.

Accordingly, there exists a need in the art for semiconductor devices, such as MOSFETs, that have a reduced scale and reduced SCE. In addition, a need exists for fabrication techniques for making those semiconductor devices.

SUMMARY OF THE INVENTION

According to one aspect of the invention, an asymmetric semiconductor device including a source and a drain formed in a layer of semiconductor material and a gate disposed on the layer of semiconductor material to define a channel interposed between the source and the drain, the gate including a gate dielectric and a gate electrode, the gate electrode spaced from the layer of semiconductor material by the gate dielectric. The gate electrode includes a first gate electrode portion having a first work function and for controlling a region of the channel adjacent the source and a second gate electrode portion adjacent the first gate electrode portion and having a second work function different from the first work function and for controlling a region of the channel adjacent the drain.

According to another aspect of the invention, an integrated circuit including an asymmetric NMOS device and an asymmetric PMOS device. The asymmetric NMOS device has a first source and a first drain formed in a layer of semiconductor material and a first gate disposed on the layer of semiconductor material to define a first channel interposed between the first source and the first drain, the first gate including a first gate dielectric and a first gate electrode, the first gate electrode spaced from the layer of semiconductor material by the first gate dielectric. The first gate electrode includes a first source side electrode portion made from a mid-gap material and having a first work function and a first drain side gate electrode portion adjacent the first source side gate electrode portion and made from an N+ doped semiconductor material to have a second work function different from the first work function. The asymmetric PMOS device has a second source and a second drain formed in the layer of semiconductor material and a second gate disposed on the layer of semiconductor material to define a second channel interposed between the second source and the second drain, the second gate including a second gate dielectric and a second gate electrode, the second gate electrode spaced from the layer of semiconductor material by the second gate dielectric. The second gate electrode includes a second source side electrode portion made from the mid-gap material and having the first work function and a second drain side gate electrode portion adjacent the second source side gate electrode portion and made from a P+ doped semiconductor material having the same base material as the N+ doped semiconductor material and having a third work function different from the first work function.

According to yet another aspect of the invention, the invention is a method of fabricating a pair of asymmetric semiconductor devices each having a dual work function gate. The method includes providing a layer of semiconductor material; forming a layer of gate dielectric material on the layer of semiconductor material; forming a dummy gate having a pair of sidewalls on the layer of gate dielectric material; forming a first gate electrode portion adjacent each sidewall of the dummy gate; removing the dummy gate; and forming a second gate electrode portion adjacent each of the first gate electrode portions such that respective pairs of first and second gate electrode portions form a gate electrode for each of the asymmetric semiconductor devices.

BRIEF DESCRIPTION OF DRAWINGS

These and further features of the present invention will be apparent with reference to the following description and drawings, wherein.

DISCLOSURE OF INVENTION

Figure 1:
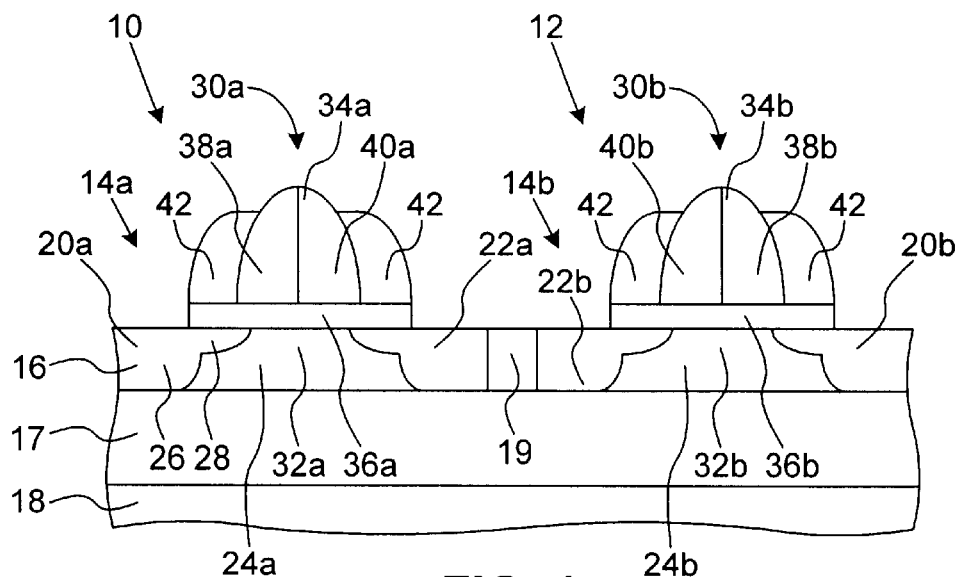
FIG. 1 is a schematic block diagram of a pair of asymmetric semiconductor devices formed in accordance with the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

One aspect of the invention relates to a semiconductor device, such as metal oxide semiconductor field effect transistor (MOSFET), having a dual work function gate. IN an embodiment of the invention, the gate is asymmetric and has a first gate portion made from a first material that has a first work function and a second gate portion adjacent the first gate portion and made from a second material having a second work function. The work functions of the materials for the first and second gate portions control device threshold along a channel of the semiconductor device. In particular, the material used for the first gate portion sets the threshold voltage ($V_t$) of a portion of the channel adjacent a source and the second gate portions set the $V_t$ of a portion of the channel adjacent a drain. The material used for the first gate portion is selected such that an absolute value of the device threshold near the source is higher than an absolute value of the device threshold near the drain.

In the illustrated embodiment, the first and second gate portions are formed using techniques traditionally used for sidewall spacer formation (e.g., angled reactive ion etching). Therefore, the overall physical length of the gate can be shorter than a gate formed using conventional photolithography techniques. Without intending to be bound by theory, it is believed that the dual work function gate described herein offers improved control over the channel so as to reduce device performance degradation caused by short channel effects (SCE).

With reference to FIG. 1, a pair of asymmetrical semiconductor devices 10 and 12 according to an exemplary embodiment of the present invention is illustrated. With the exception of manufacturing process variations and any intentionally introduced variations, the semiconductor devices 10 and 12 can be mirror images of each other. The illustrated semiconductor devices 10 and 12 are MOSFETs used, for example, in the construction of a complimentary metal oxide semiconductor (CMOS) integrated circuit. As one skilled in the art will appreciate, however, the gate structure of the semiconductor devices 10 and 12 and the techniques for fabricating those gate structures can be used for other types of devices (e.g., other types of transistors, memory cells, etc.) and the illustrated MOSFETs are exemplary. However, the semiconductor devices 10 and 12 will sometimes be referred to herein as MOSFETs 10 and 12. The MOSFETs 10 and 12 can both be configured as NMOS devices or as PMOS devices. Alternatively, one of the MOSFETs 10 or 12 can be configured as an NMOS device and the other as a PMOS device.

The MOSFETs 10 and 12 are formed using respective active regions 14a and 14b formed in a layer of semiconductor material 16. The layer of semiconductor material 16 can be, for example, a silicon substrate for the formation of bulk-type devices. Alternatively, and as illustrated, the layer of semiconductor material 16 can be, for example, a silicon film formed on a layer of insulating material 17 formed on a semiconductor substrate 18 so that the resultant devices are formed in a semiconductor-on-insulator (SOI) format, as is well known in the art. Isolation regions 19 can be used to isolate the MOSFETs 10 and 12 from each other and other adjacent devices.

Each MOSFET 10 and 12 respectively includes a source 20a and 20b, a drain 22a and 22b and a body 24a and 24b. The bodies 24a and 24b are respectively disposed between the source 20 of each MOSFET 10, 12 and the drain 22 of each MOSFET 10, 12. In the illustrated embodiment, each source 20 and each drain 22 includes a deep doped region 26 and an extension region 28.

Each MOSFET 10 and 12 respectively includes a gate 30a and 30b. The gates 30a and 30b are disposed on the layer of semiconductor material 16 over the respective bodies 24a and 24b. The gates 30a and 30b define respective channels 32a and 32b within the bodies 24a and 24b (the channels 32a and 32b being interposed between their respective sources 20a and 20b and drains 22a and 22b).

The gates 30a and 30b each include a gate electrode 34a and 34b spaced apart from the layer of semiconductor material 16 by respective gate dielectrics 36a and 36b. As illustrated, the extensions 28 may laterally diffuse a short distance under the gates 30a and 30b, as is known in the art.

Each gate electrode 34a and 34b respectively has a first gate electrode portion 38a and 38b and a second gate electrode portion 40a and 40b. In one embodiment, the material of the first gate electrode portions 38a and 38b is selected to be different from the material used for the second gate electrode portions 40a and 40b. The materials are selected such that the first gate electrode portions 38a and 38b have a higher or, if appropriate, a lower work function than the material of the second gate electrode portions 40a and 40b.

In the illustrated embodiment, the MOSFETs 10 and 12 are generally mirror images of one another. The first gate electrode portion 38a of the MOSFET 10 is disposed over a portion of the channel 32a adjacent the source 20a such that a region of the channel 32a adjacent the source 20a is controlled by the first gate electrode portion 38a. The second gate electrode portion 40a of the MOSFET 10 is disposed over a portion of the channel 32a adjacent the drain 22a such that a region of the channel 32a adjacent the drain 22a is controlled by the second gate electrode portion 40a. Similarly, the first gate electrode portion 38b of the MOSFET 12 is disposed over a portion of the channel 32b adjacent the source 20b such that a region of the channel 32b adjacent the source 20b is controlled by the first gate electrode portion 38b. The second gate electrode portion 40b of the MOSFET 12 is disposed over a portion of the channel 32b adjacent the drain 22b such that a region of the channel 32b adjacent the drain 22b is controlled by the second gate electrode portion 40b. It is noted that in symmetrical devices the source and the drain are interchangeable, but in asymmetrical devices the source and the drain are typically specified such that integrated circuits are arranged to take advantage of device properties. However, the devices 10, 12 can be configured so that the gates 30 are mirror images of one another, but the sources 20 and the drains 22 are not.

Depending on design considerations, integrated circuit layout and device type (e.g., NMOS or PMOS), the designer can select the work function of the material used for the first gate electrode portions 38a and 38b to be higher or lower than the second gate electrode portions 40a and 40b. For example, in an NMOS device, if an absolute value of a device threshold for a source 20 side of the channel 32 is to be higher than an absolute value of a device threshold for a drain 22 side of the channel 32, then the work function of the first gate electrode portion 38 formed adjacent the source/body junction should be higher than work function of the second gate electrode portion 40 formed adjacent the drain/body junction. In a PMOS device, if an absolute value of a device threshold for a source 20 side of the channel 32 is to be higher than an absolute value of a device threshold for a drain 22 side of the channel 32, then the work function of the first gate electrode portion 38 formed adjacent the source/body junction should be lower than work function of the second gate electrode portion 40 formed adjacent the drain/body junction. Expressing relative device thresholds in terms of absolute value is done to take into account differences in actual voltage applied to NMOS device versus PMOS devices. The differential in device threshold between the foregoing portions of the channel will typically be up to a few tenths of a volt.

The MOSFETs 10 and 12 can be provided with sidewall spacers 42, as is known in the art. Also, the MOSFETs 10 and 12 can be provided with a gate electrode contacts (not shown) used in establishing electrical connection to the gate electrodes 34a and 34b, including the first and second gate electrode portions 38 and 40. In addition, the MOSFETs 10 and 12 can each be provided with a source contact (not shown) and a drain contact (not shown). The source contacts and the drain contacts can be silicide regions as is known in the art. If appropriate, the gate electrode contacts can also be a silicide regions or can be formed from a metal layer or from another other appropriate material.

Figure 2:
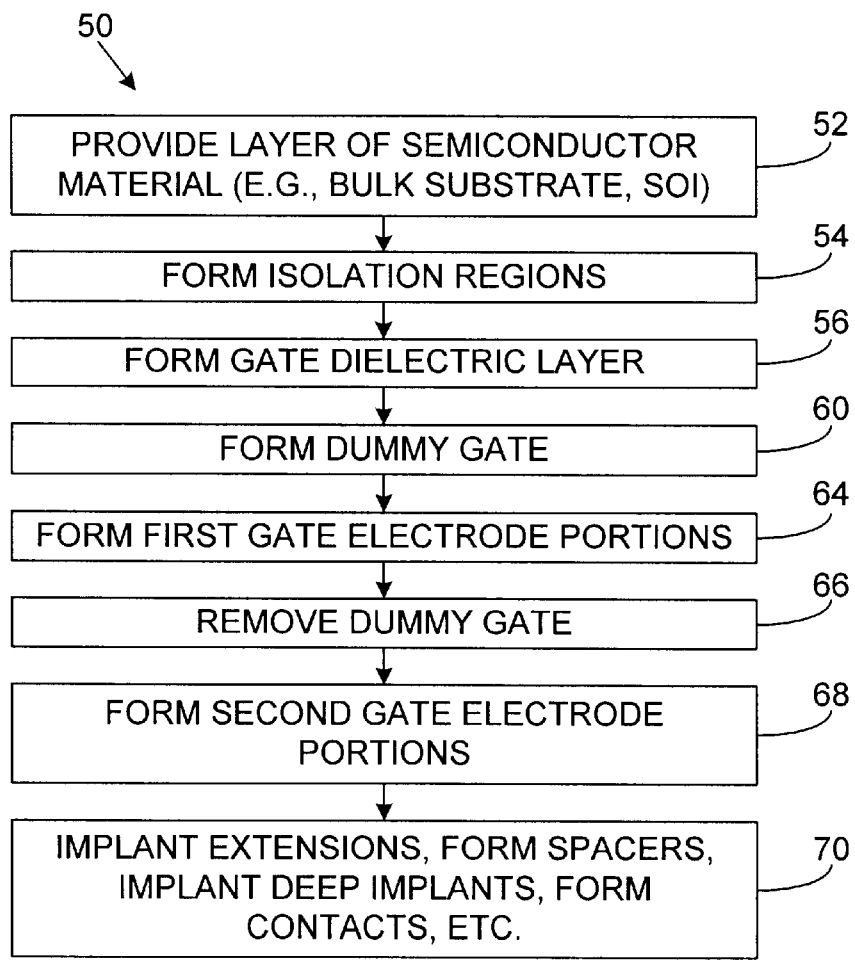
FIG. 2 is a flow chart illustrating a method of forming the asymmetric semiconductor devices of FIG. 1.

Referring now to FIG. 2, a method 50 of simultaneously forming the MOSFETs 10 and 12 is illustrated. With additional reference to FIG. 3A, the method 50 starts in step 52 where the layer of semiconductor material 16 is provided. As indicated above, the layer of semiconductor material 16 can be a semiconductor substrate (such as a silicon substrate) for the formation of bulk-type devices. In the illustrated embodiment, the layer of semiconductor material 16 is a semiconductor film (such as a silicon film or a silicon-germanium film) formed as part of a SOI substrate stack. In step 54, isolation regions 19 (for example, shallow trench isolation (STI) regions) can be formed in the layer of semiconductor material 16 to define the size and placement of multiple active regions 14a and 14b (FIG. 1) within the layer of semiconductor material 16.

Next, in step 56, a layer of material 58 used to form the gate dielectrics 36a and 36b is formed on the layer of semiconductor material 16. The layer of gate dielectric material 58 can be formed by growing or depositing the material on top of the layer or semiconductor material 16. The layer of gate dielectric material 58 can be, for example, silicon dioxide or any other appropriate dielectric material.

Figure 3A:
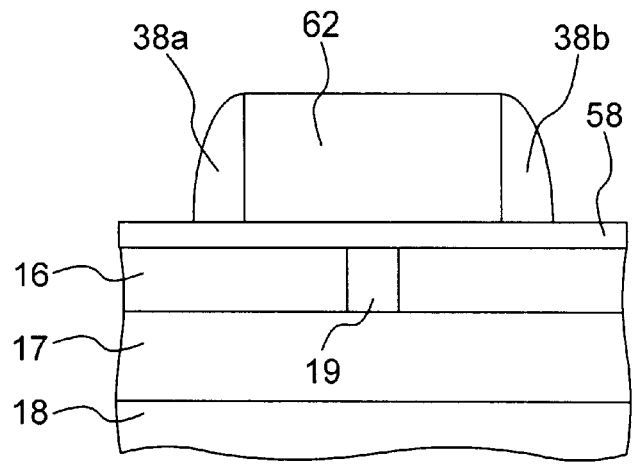
FIGS. 3A through 3C illustrate the asymmetric semiconductor devices of FIG. 1 in various stages of manufacture.

With continued reference to FIGS. 2 and 3A, the method 50 continues in step 60 where a dummy gate electrode portion 62 is formed. As will become more apparent below, the dummy gate 62 does not form a part of the MOSFETs 10 and 12, but assists in defining the placement of the first gate electrode portions 38a and 38b. The dummy gate 62 is formed by growing or depositing a layer of dummy gate material on the layer of dielectric material 58. The layer of material used to form the dummy gate 62 is then patterned using conventional techniques to have a placement and size corresponding to the desired placement of the first gate electrode portions 38a and 38b. Patterning of the dummy gate 62 can be carried out by techniques such as wet-chemical etching or dry etching.

Thereafter, in step 64, the first gate electrode portions 38a and 38b are formed. The material used to form the first gate electrode portions 38a and 38b can be any suitable material, including for example, polycrystalline silicon, polycrystalline silicon-germanium, a metal (e.g., tungsten, tantalum, aluminum, nickel, ruthenium, rhodium, palladium, platinum, etc.) and/or a metal-containing compound (e.g., tantalum nitride, titanium nitride, etc.).

In the illustrated embodiment, the first gate electrode portions 38a and 38b are formed using techniques similar to those used for sidewall spacer formation. For instance, the first gate electrode portions 38a and 38b can be formed by depositing the desired material and anisotropically etching back the deposited material to the layer of dielectric material 58. In an alternative embodiment, the material used to form the first gate electrode portions 38a and 38b can be deposited and patterned using other techniques, such as, for example, wet-chemical etching or dry etching with the assistance of a mask layer.

Figure 3B:
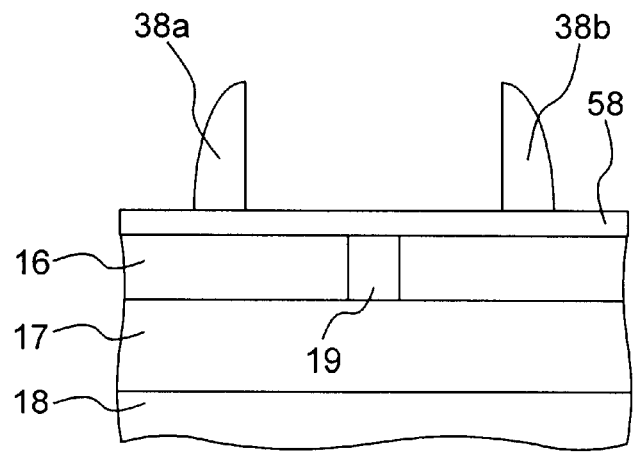

With additional reference to FIG. 3B, the method 50 continues in step 66 where the dummy gate 62 is removed using an appropriate technique, such as, for example, wet-chemical etching or dry etching.

Figure 3C:
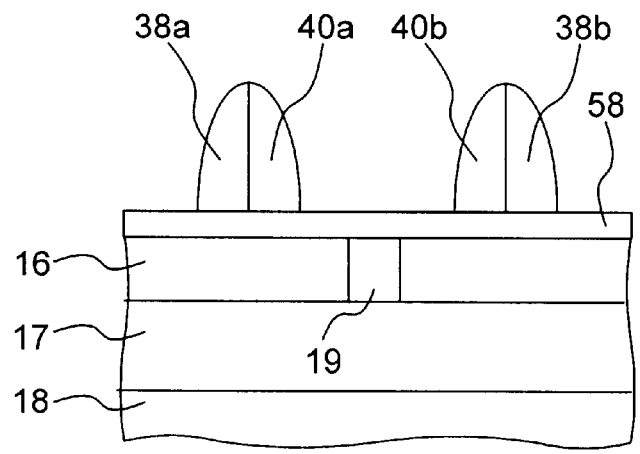

Next, in step 68 and as illustrated in FIG. 3C, the second gate electrode portions 40a and 40b are respectively formed adjacent the first gate electrode portions 38a and 38b. More specifically, the second gate electrode portions 40a and 40b are formed adjacent surfaces of the first gate electrode portions 38a and 38b that were disposed against the dummy gate 62 before the dummy gate 62 was removed.

As indicated, in one embodiment of the invention, the material used to form the second gate electrode portions 40a and 40b is different from the material used to form the first gate electrode portions 38a and 38b. The materials that can be used for the second gate electrode portions 40a and 40b include, for example, polycrystalline silicon, polycrystalline silicon-germanium, a metal (e.g., tungsten, tantalum, aluminum, nickel, ruthenium, rhodium, palladium, platinum, etc.) and/or a metal-containing compound (e.g., tantalum nitride, titanium nitride, etc.). In an alternative embodiment, the second gate electrode portions 40a and 40b and the first gate electrode portions 38a and 38b are made from the same semiconductor material, but receive different doping concentrations.

The second gate electrode portions 40a and 40b are formed to have a desired width (or length) as measured along the upper surface of the layer of dielectric material 58. This width can be selected to be substantially the same as a corresponding width of the first gate electrode portions 38a and 38b. Alternatively, the second gate electrode portions 40a and 40b can be wider or narrower than the first gate electrode portions 38a and 38b.

The second gate electrode portions 40a and 40b can be formed using techniques similar to those used for sidewall spacer formation. For instance, the second gate electrode portions 40a and 40b can be formed by depositing the desired material and anisotropically etching back the deposited material to the layer of gate dielectric material 58. In an alternative embodiment, the material used to form the second gate electrode portions 40a and 40b can be deposited and patterned using other techniques, such as, for example, wet-chemical etching or dry etching with the assistance of a mask layer.

In step 70, and with reference back to FIG. 1, other components of the MOSFETs 10 and 12 can be formed. For example, the extensions 28 can be implanted. Formation of shallow source 20 and drain 22 extensions 28, such as by using a lightly doped drain (LDD) technique, is well known in the art and will not be described in detail herein. Briefly, for a P-type extension region 28, ions such as boron, gallium or indium can be implanted. For an N-type extension region 28, ions such as antimony, phosphorous or arsenic can be implanted. The ions used to form the extensions 28 may diffuse slightly under the gates 30a and 30b as is conventional.

Other processing in step 70 can include formation of the sidewall spacers 42. The spacers 42 can be formed from a material such as a nitride (e.g., silicon nitride, or $Si_3N$). The formation of the spacers 42 is well known in the art and will not be described in greater detail.

The spacers 42 and the gates 30a and 30b act as a self-aligned mask for implantation of the deep doped regions 26. Implanting dopant species to form the deep doped regions 26 of the sources 20a and 20b and the drains 22a and 22b, respectively, is well known in the art and will not be described in great detail herein. Briefly, to form a P-type deep doped region 26, ions such as boron, gallium or indium can be implanted. N-type deep doped regions 26 can be formed by implanting ions, such as antimony, phosphorous or arsenic. Following implantation of the deep doped source and drain regions 26, an anneal cycle can be carried out to activate the implanted ions. It is noted that the ions used to form the deep doped regions 26 may laterally diffuse slightly under the spacers 42 as is conventional.

Other additional processing can include for example, the formation of source 20 contacts, drain 22 contacts and gate electrode 34a and 34b contacts. Therefore, the layer of gate dielectric material 58 can be patterned to permit, for example, silicidation of the layer of semiconductor material 16 for the formation of source 20 and drain 22 contacts. Patterning of the gate dielectric material 58 can be carried out before or after implantation of ion species to form the extensions 28 and/or deep doped regions 26 as is known in the art. An oxide cap (not shown) can also be formed.

In one exemplary embodiment, the MOSFET 10 is configured as an NMOS device and the MOSFET 12 is configured as a PMOS device. In this example, a mid-gap material (e.g., a metal or metal-containing compound having a work function near the center of the band-gap (about 4.6 eV)) is selected for use in both NMOS devices and PMOS devices as the first gate electrode portions 38a and 38b. A semiconductor material (such as polysilicon) is selected for second gate electrode portions 40a and 40b. For the NMOS device, the second gate electrode portion 40a is doped with N+ type ions to have a work function of about 4.15 eV. For the PMOS device, the second gate electrode portion 40b is doped with P+ type ions to have a work function of about 5.1 eV. In this embodiment, the NMOS device and the PMOS device have second gate electrode portions 40a and 40b made from the same base material. One skilled in the art will appreciate that, in an alternative arrangement, the mid-gap material can be used for the second gate electrode portions 40a and 40b and the semiconductor material can be used for the first gate electrode portions 38a and 38b. Selecting the same materials for the gates 30 of both the NMOS device and the PMOS device can simplify fabrication of the devices and reduce material integration issues. However, in an alternative embodiment, a first pair of materials is selected for the NMOS device and a second pair of materials is selected for the PMOS device to provide desired characteristics respectively to the NMOS device and the PMOS device.

The method 50 shows in a specific order of steps for fabricating the MOSFETs 10 and 12. However, it is understood that the order may differ from that depicted. For example, the order of two or more steps may be altered relative to the order shown. Also, two or more steps may be carried out concurrently or with partial concurrence. In addition, various steps may be omitted and other steps may be added. It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

For example, only one MOSFET 10 or 12 can be formed to have the structure described herein. In this embodiment, one of the first gate electrode portions 38a or 38b can be removed after formation or, alternatively, is not formed in step 64.

What is claimed is:

1. An asymmetric semiconductor device comprising:
   a source and a drain formed in a layer of semiconductor material; and
   a gate disposed on the layer of semiconductor material to define a channel interposed between the source and the drain, the gate including a gate dielectric and a gate electrode, the gate electrode spaced from the layer of semiconductor material by the gate dielectric, and the gate electrode including:
      a first gate electrode portion having a first work function and for controlling a region of the channel adjacent the source; and
      a second gate electrode portion adjacent the first gate electrode portion and having a second work function different from the first work function and for controlling a region of the channel adjacent the drain.

2. The semiconductor device according to claim 1, wherein an absolute value of a device threshold in the region of the channel adjacent the source is higher than an absolute value of a device threshold in the region of the channel adjacent the drain.

3. The semiconductor device according to claim 1, wherein the semiconductor device is an NMOS device and the first work function is higher than the second work function.

4. The semiconductor device according to claim 1, wherein the semiconductor device is a PMOS device and the first work function is lower than the second work function.

5. The semiconductor device according to claim 1, wherein the first gate electrode portion is made from a first material and the second gate electrode portion is made from a second material different from the first material.

6. The semiconductor device according to claim 1, wherein the first gate electrode portion and the second gate electrode portion are each formed using a sidewall spacer formation technique.

7. The semiconductor device according to claim 1, wherein the layer of semiconductor material is a semiconductor film disposed on an insulating layer, the insulting layer being disposed on a semiconductor substrate.

8. An integrated circuit comprising:
   an asymmetric NMOS device having a first source and a first drain formed in a layer of semiconductor material and a first gate disposed on the layer of semiconductor material to define a first channel interposed between the first source and the first drain, the first gate including a first gate dielectric and a first gate electrode, the first gate electrode spaced from the layer of semiconductor material by the first gate dielectric, and the first gate electrode including:
a first source side electrode portion made from a mid-gap material and having a first work function; and
a first drain side gate electrode portion adjacent the first source side gate electrode portion and made from an N+ doped semiconductor material to have a second work function different from the first work function; and
an asymmetric PMOS device having a second source and a second drain formed in the layer of semiconductor material and a second gate disposed on the layer of semiconductor material to define a second channel interposed between the second source and the second drain, the second gate including a second gate dielectric and a second gate electrode, the second gate electrode spaced from the layer of semiconductor material by the second gate dielectric, and the second gate electrode including:
a second source side electrode portion made from the mid-gap material and having the first work function; and
a second drain side gate electrode portion adjacent the second source side gate electrode portion and made from a P+ doped semiconductor material having the same base material as the N+ doped semiconductor material and having a third work function different from the first work function.

9. The integrated circuit according to claim 8, wherein an absolute value of a device threshold in a region of the first channel adjacent the first source is higher than an absolute value of a device threshold in a region of the first channel adjacent the first drain and an absolute value of a device threshold in a region of the second channel adjacent the second source is higher than an absolute value of a device threshold in a region of the second channel adjacent the second drain.

10. The integrated circuit according to claim 8, wherein the semiconductor material of the first and second drain side gate electrodes is polycrystalline silicon.

11. The integrated circuit according to claim 8, wherein the first source side gate electrode portion, the first drain side electrode portion, the second source side electrode portion and the second drain side electrode portion are each formed using a sidewall spacer formation technique.

12. The integrated circuit according to claim 8, wherein the layer of semiconductor material is a semiconductor film disposed on an insulating layer, the insulting layer being disposed on a semiconductor substrate.

13. A method of fabricating a pair of asymmetric semiconductor devices each having a dual work function gate, comprising the steps of:

providing a layer of semiconductor material;
forming a layer of gate dielectric material on the layer of semiconductor material;
forming a dummy gate having a pair of sidewalls on the layer of gate dielectric material;
forming a first gate electrode portion adjacent each sidewall of the dummy gate;
removing the dummy gate; and
forming a second gate electrode portion adjacent each of the first gate electrode portions such that respective pairs of first and second gate electrode portions form a gate electrode for each of the asymmetric semiconductor devices.

14. The method according to claim 13, wherein each of the first gate electrode portions have a first work function and each of the second gate electrode portions have a second work function different from the first work function.

15. The method according to claim 13, wherein the first gate electrode portions are formed using a sidewall spacer formation technique.

16. The method according to claim 15, wherein the second gate electrode portions are formed using a sidewall spacer formation technique.

17. The method according to claim 13, wherein the second gate electrode portions are formed using a sidewall spacer formation technique.

18. The method according to claim 13, further comprising the steps of implanting ion species into the layer of semiconductor material to form a source and a drain for each asymmetric semiconductor device, and wherein the respective gate electrodes define a channel interposed between the source and the drain of each asymmetric semiconductor device.

19. The method according to claim 18, wherein a work function of each first gate electrode portion and a work function of each second gate electrode portion are selected such that an absolute value of a device threshold in a respective channel region adjacent each source is selected to be higher than an absolute value of a device threshold in a respective channel region adjacent each drain.

20. The method according to claim 13, wherein the first gate electrode portions are made from a first material and the second gate electrode portions are made from a second material different from the first material.

21. The method according to claim 13, wherein the layer of semiconductor material is a semiconductor film disposed on an insulating layer, the insulting layer being disposed on a semiconductor substrate.

* * * * *